(12) United States Patent
Brunot et al.

(10) Patent No.: US 7,730,353 B2
(45) Date of Patent: Jun. 1, 2010

(54) MEMORY-BASED TRIGGER GENERATION SCHEME IN AN EMULATION ENVIRONMENT

(76) Inventors: Gregoire Brunot, Mentor Graphics Corporation, Meta Systems Division, 3 Avenue du Canada, Batiment Sigma, 91975 Courtaboeuf Cedex (FR); Charles Selvidge, Mentor Graphics Corporation, 300 Third Ave., Waltham, MA (US) 02451

( * ) Notice: Subject to any disclaimer, the term of this patent is extended or adjusted under 35 U.S.C. 154(b) by 609 days.

(21) Appl. No.: 11/517,150

(22) Filed: Sep. 5, 2006

(65) Prior Publication Data

US 2007/0226541 A1   Sep. 27, 2007

Related U.S. Application Data

(63) Continuation of application No. PCT/EP2006/060333, filed on Feb. 28, 2006.

(51) Int. Cl.
    *G06F 11/00* (2006.01)
(52) U.S. Cl. ...................................................... 714/29
(58) Field of Classification Search .................. 714/28, 714/29
    See application file for complete search history.

(56) References Cited

U.S. PATENT DOCUMENTS

| | | | | |
|---|---|---|---|---|
| 5,265,254 A * | 11/1993 | Blasciak et al. | ............. | 717/130 |
| 5,425,036 A | 6/1995 | Liu et al. | | |
| 5,453,995 A * | 9/1995 | Behrens | ....................... | 714/743 |
| 5,848,264 A | 12/1998 | Baird et al. | | |
| 6,131,080 A * | 10/2000 | Raimi et al. | ................... | 703/14 |
| 6,141,636 A * | 10/2000 | Sarno et al. | .................... | 703/23 |
| 6,694,464 B1 | 2/2004 | Quayle et al. | | |
| 6,732,068 B2 * | 5/2004 | Sample et al. | ................. | 703/24 |
| 2001/0010036 A1 * | 7/2001 | Stewart et al. | ................. | 703/23 |
| 2002/0194543 A1 | 12/2002 | Veenstra et al. | | |
| 2003/0101401 A1 * | 5/2003 | Salvi et al. | .................... | 714/755 |
| 2004/0028012 A1 * | 2/2004 | Walker et al. | ................ | 370/330 |
| 2004/0148153 A1 * | 7/2004 | Beletsky et al. | ................ | 703/27 |
| 2006/0206777 A1 * | 9/2006 | Shen | ........................... | 714/755 |
| 2007/0219771 A1 * | 9/2007 | Verheyen et al. | .............. | 703/15 |

OTHER PUBLICATIONS

Kirschbaum, A. et al., "A Reconfigurable Hardware-Monitor for Communication Analysis in Distributed Real-Time Systems," XP002387817, pp. 61-66 (Mar. 30, 1998).
International Search Report and Written Opinion (PCT/EP2006/060333).
International Preliminary Report on Patentability for PCT/EP2006/060333, 1 pg., Sep. 2, 2008.
Written Opinion of the International Searching Authority for PCT/EP2006/060333, 5 pp., Sep. 2, 2008.

* cited by examiner

*Primary Examiner*—Scott T Baderman
*Assistant Examiner*—Yair Leibovich
(74) *Attorney, Agent, or Firm*—Klarquist Sparkman, LLP

(57) ABSTRACT

A system and method are disclosed for generating triggers within a hardware emulator. The system allows for dynamic reconfiguration of the trigger generation scheme during emulation. In one aspect, input probe signals are received on an address port to a memory from an integrated circuit within the emulator. The memory outputs from a data port, data, which is addressed, at least in part, by the input probe signals. The data output from the data port may be sent through further combinatorial logic or directly connected to a logic analyzer and represents trigger information. In another aspect, the trigger generation scheme may be reconfigured dynamically during emulation. For example, where the memory is a dual-port RAM, an emulation host can write to the memory to perform the reconfiguration.

18 Claims, 8 Drawing Sheets

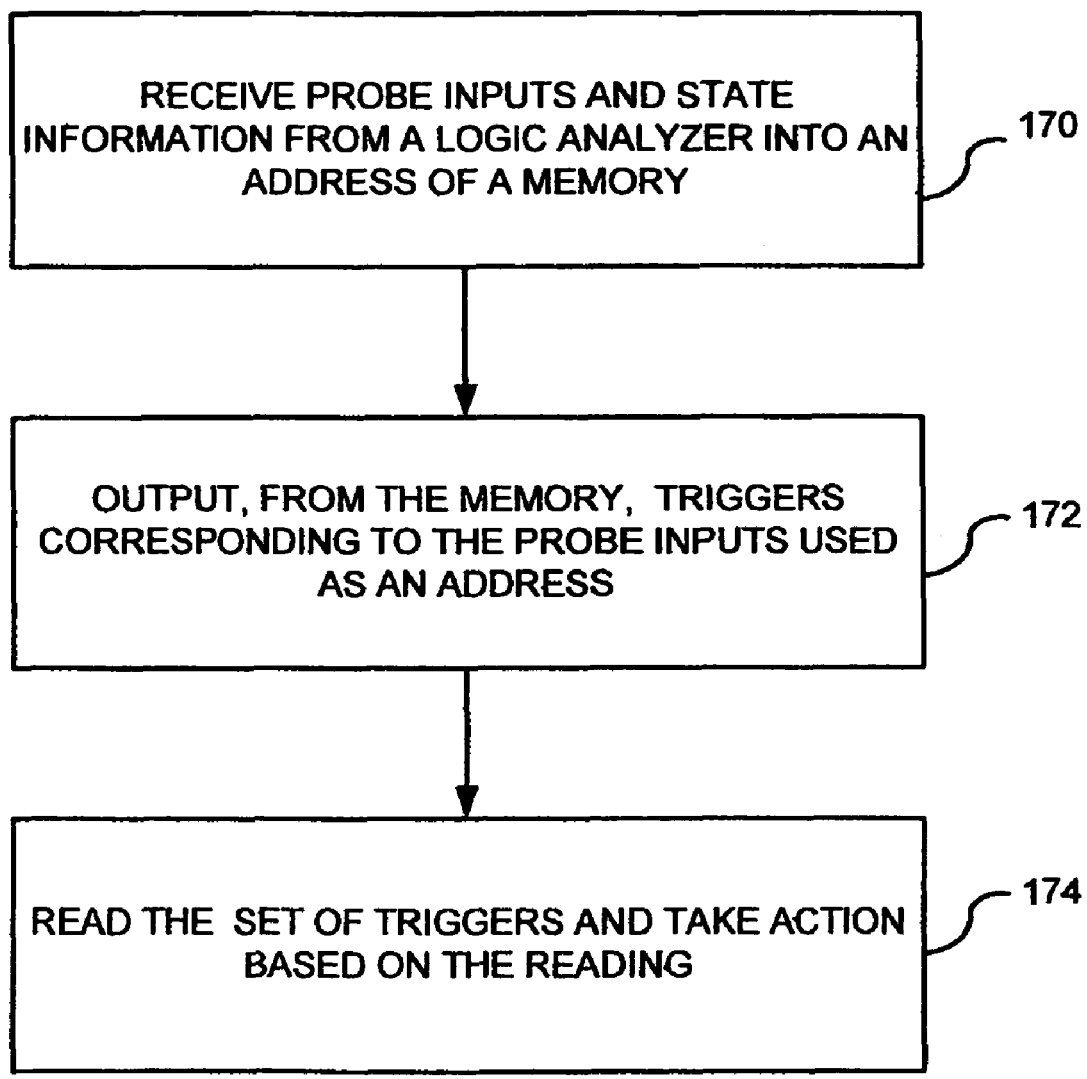

MEMORY-BASED TRIGGER GENERATION SCHEME IN AN EMULATION ENVIRONMENT

CROSS REFERENCE TO RELATED APPLICATION

This application is a continuation of copending International Patent Application No. PCT/EP2006/060333, filed on Feb. 28, 2006. This prior application is incorporated by reference herein.

FIELD OF THE INVENTION

The present invention generally relates to hardware emulators, and more particularly to the use of triggers in a hardware emulator.

BACKGROUND

Today's sophisticated SoC (System on Chip) designs are rapidly evolving and nearly doubling in size with each generation. Indeed, complex designs have nearly exceeded 50 million gates. This complexity, combined with the use of devices in industrial and mission-critical products, has made complete design verification an essential element in the semiconductor development cycle. Ultimately, this means that every chip designer, system integrator, and application software developer must focus on design verification.

Hardware emulation provides an effective way to increase verification productivity, speed up time-to-market, and deliver greater confidence in the final SoC product. Even though individual intellectual property blocks may be exhaustively verified, previously undetected problems appear when the blocks are integrated within the system. Comprehensive system-level verification, as provided by hardware emulation, tests overall system functionality, IP subsystem integrity, specification errors, block-to-block interfaces, boundary cases, and asynchronous clock domain crossings. Although design reuse, intellectual property, and high-performance tools all help by shortening SoC design time, they do not diminish the system verification bottleneck, which consumes 60-70% of the design cycle. As a result, designers can implement a number of system verification strategies in a complementary methodology including software simulation, simulation acceleration, hardware emulation, and rapid prototyping. But, for system-level verification, hardware emulation remains a favorable choice due to superior performance, visibility, flexibility, and accuracy.

A short history of hardware emulation is useful for understanding the emulation environment. Initially, software programs would read a circuit design file and simulate the electrical performance of the circuit very slowly. To speed up the process, special computers were designed to run simulators as fast as possible. IBM's Yorktown "simulator" was the earliest (1982) successful example of this—it used multiple processors running in parallel to run the simulation. Each processor was programmed to mimic a logical operation of the circuit for each cycle and may be reprogrammed in subsequent cycles to mimic a different logical operation. This hardware 'simulator' was faster than the current software simulators, but far slower than the end-product ICs. When Field Programmable Gate Arrays (FPGAs) became available in the mid-80's, circuit designers conceived of networking hundreds of FPGAs together in order to map their circuit design onto the FPGAs and the entire FPGA network would mimic, or emulate, the entire circuit. In the early 90's the term "emulation" was used to distinguish reprogrammable hardware that took the form of the design under test (DUT) versus a general purpose computer (or work station) running a software simulation program.

Soon, variations appeared. Custom FPGAs were designed for hardware emulation that included on-chip memory (for DUT memory as well as for debugging), special routing for outputting internal signals, and for efficient networking between logic elements. Another variation used custom IC chips with networked single bit processors (so-called processor based emulation) that processed in parallel and usually assumed a different logic function every cycle.

Physically, a hardware emulator resembles a large server. Racks of large printed circuit boards are connected by backplanes in ways that facilitate a particular network configuration. A workstation connects to the hardware emulator for control, input, and output.

Before the emulator can emulate a DUT, the DUT design must be compiled. That is, the DUT's logic must be converted (synthesized) into code that can program the hardware emulator's logic elements (whether they be processors or FPGAs). Also, the DUT's interconnections must be synthesized into a suitable network that can be programmed into the hardware emulator. The compilation is highly emulator specific and can be time consuming.

Once the design is loaded and running in the hardware emulator, it is important to be able to analyze embedded signals for rapid verification and debug. The most common technique for such analysis is through the use of hardware probes that in turn are used to generate triggers. A probe is a hardware line coupled to an integrated circuit for analyzing the state of a signal within the integrated circuit. One or more probes are combined together in various manners to generate a trigger, which is activated in response to an event or the reaching of a state within the circuit. Triggers may be used to turn on or off various streams of data for tracing circuit activity and may be either synchronous or asynchronous. Synchronous triggers have timing coordinated with the system clock while asynchronous triggers can be generated at any time during the emulation.

Obviously, the more probes available to the designer, the more information the designer has for debugging the circuit and the more complex triggers can be defined. In a large circuit, thousands of probes may exist that need to be monitored by a logic analyzer. Unfortunately, the larger and more complex the circuits are becoming, the more probes are needed. However, these probes must be combined and reduced in order to feed limited trigger inputs to the logic analyzer. Thus, to reduce the number of triggers to the logic analyzer, a probe reduction scheme is typically accomplished through the use of standard gates, such as AND and OR gates. For example, multiple probes may be input into a large AND gate so that if all the conditions are true, the trigger is activated.

While the use of AND and OR gates have become the standard for a probe reduction scheme, such solutions do not allow for very complex trigger mechanisms. For example, sometimes it is desirable to have a complex logical combination of probes based on the design. In a simple example, two probes A and B may be logically combined as A&B using an AND gate. To change this simple function to A OR B, while still using only the available AND gate, one would need to invert both A and B to produce !A&!B and invert the result to produce !(!A&!B)=A OR B. Thus, a simple example of A OR B requires three inverters and an AND gate. In reality, the number of probe inputs is much greater and the logical combinations can quickly become too complex to manage.

Additionally, if a change in the probe reduction scheme is desired, it is necessary to recompile the entire design, which is time consuming and costly. For example, if the user wants to change a trigger generation or reduction scheme to better debug the system, it is necessary to change combinatorial logic associated with the trigger signals. But such changing of combinatorial logic requires recompilation of the design.

Thus, it is desirable to provide a more powerful and flexible scheme for trigger generation in a hardware emulation environment.

SUMMARY

Described below is a system and method for trigger generation within a hardware emulator wherein complex probe reduction and trigger generation can be accomplished with little or no additional logic. Additionally, the system allows for dynamic reconfiguration of the reduction scheme and trigger generation scheme during emulation without recompiling the design.

In one aspect, input probe signals are received on an address port to a memory from an integrated circuit within the emulator. The memory outputs data that is addressed, at least in part, by the input probe signals. The data output from the memory is a set of trigger signals, which may be sent through further combinatorial logic or may be sent directly to a logic analyzer for analysis. A similar scheme may also be used for probe reduction.

In another aspect, the trigger generation scheme may be reconfigured dynamically during emulation. For example, where the memory is a dual-port RAM, an emulation host can write to the memory to perform the reconfiguration without turning off the emulator clock.

These features and others of the described embodiments will be more readily apparent from the following detailed description, which proceeds with reference to the accompanying drawings.

BRIEF DESCRIPTION OF THE DRAWINGS

FIG. 8 is another flowchart of a method for trigger generation including using state information from a logic analyzer.

DETAILED DESCRIPTION

Figure 1:
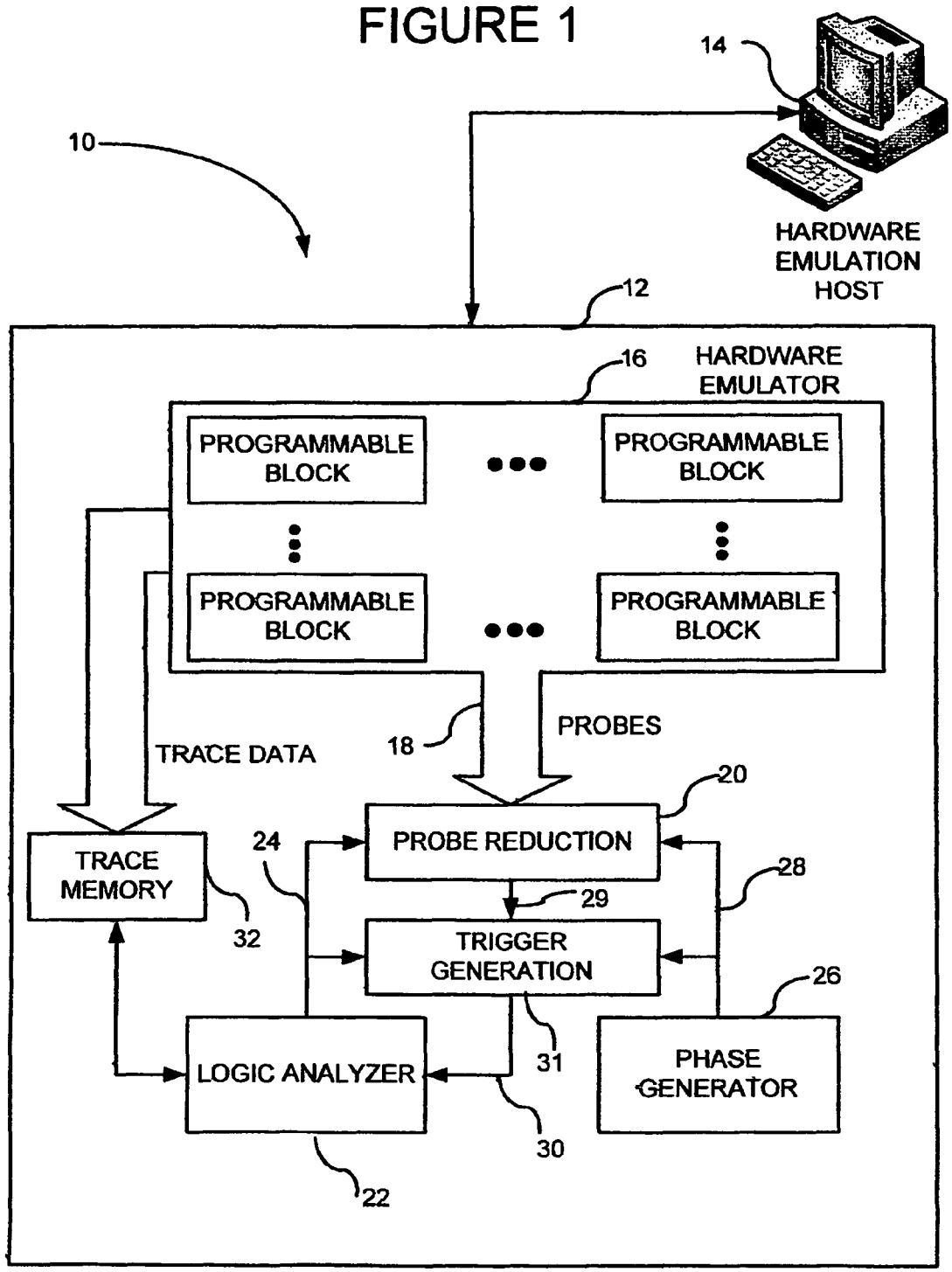
FIG. 1 is a system diagram of a hardware emulator environment including a probe reduction block and trigger generation block according to the invention.

FIG. 1 shows an emulator environment 10 including a hardware emulator 12 coupled to a hardware emulator host 14. The emulator host 14 may be any desired type of computer hardware and generally includes a user interface through which a user can load, compile and download a design to the emulator 12. Additionally, the user can control breakpoints, and reconfigure the probe reduction scheme and the trigger generation scheme within the emulator, as further described below.

The emulator 12 includes an array of programmable logic blocks 16 programmed with the user's design downloaded from the emulator host 14. The programmable logic blocks 16 are generally programmable integrated circuits, such as FPGAs. The programmable logic blocks 16 may be located on one or more printed circuit boards (not shown). Probes 18 are coupled to one or more of the programmable logic blocks as defined by the user's design. The probes 18 are hardware lines coupled to one or more of the programmable logic blocks 16 and are activated upon detection of a certain state of the circuit programmed within the emulator 12. For example, some designs may have one or more probes per FPGA. The number of probes 18 depends on the particular design, but with large designs, probe reduction logic, such as shown at 20, is generally required. As further described below, the structure of probe reduction logic 20 is different from prior art techniques and offers an efficient probe reduction scheme through the use of memory. A benefit of using memory as a part of the probe reduction scheme is that a user may choose to reconfigure the probe reduction scheme during the emulation without stopping an emulation clock. An additional benefit is that complex reduction schemes can be accomplished merely by changing memory data. Additionally, the probe reduction logic 20 can receive additional inputs used in the probe reduction, such as state information from a logic analyzer 22 (as shown at 24) or phase information from a phase generator 26 (as shown at 28).

The probe reduction logic 20 outputs a reduced set of probes 29 that are input into a trigger generation block 31. The trigger generation block 31 is similar to the probe reduction logic 20 in that it uses memory as a basis for trigger generation. Thus, all of the benefits associated with probe reduction are also included in the trigger generation. Additionally, inputs such as state information 24 and phase information 28 may be used. The trigger generation block 31 generates triggers 30 that are fed into the logic analyzer 22. The logic analyzer 22 uses the triggers 30 output from the trigger generation logic 31 to control a trace memory 32 by initiating or stopping a trace depending on how the user configured the system. Alternatively, the logic analyzer 22 may use the trigger activation to start or stop emulator clocks.

It should be recognized that the probe reduction logic 20 can be eliminated entirely so that the probes 18 are input directly into the trigger generation logic 31. It is up to the designer how to structure the trigger generation and depends on the number of probes and the size of the memory used.

Figure 2:
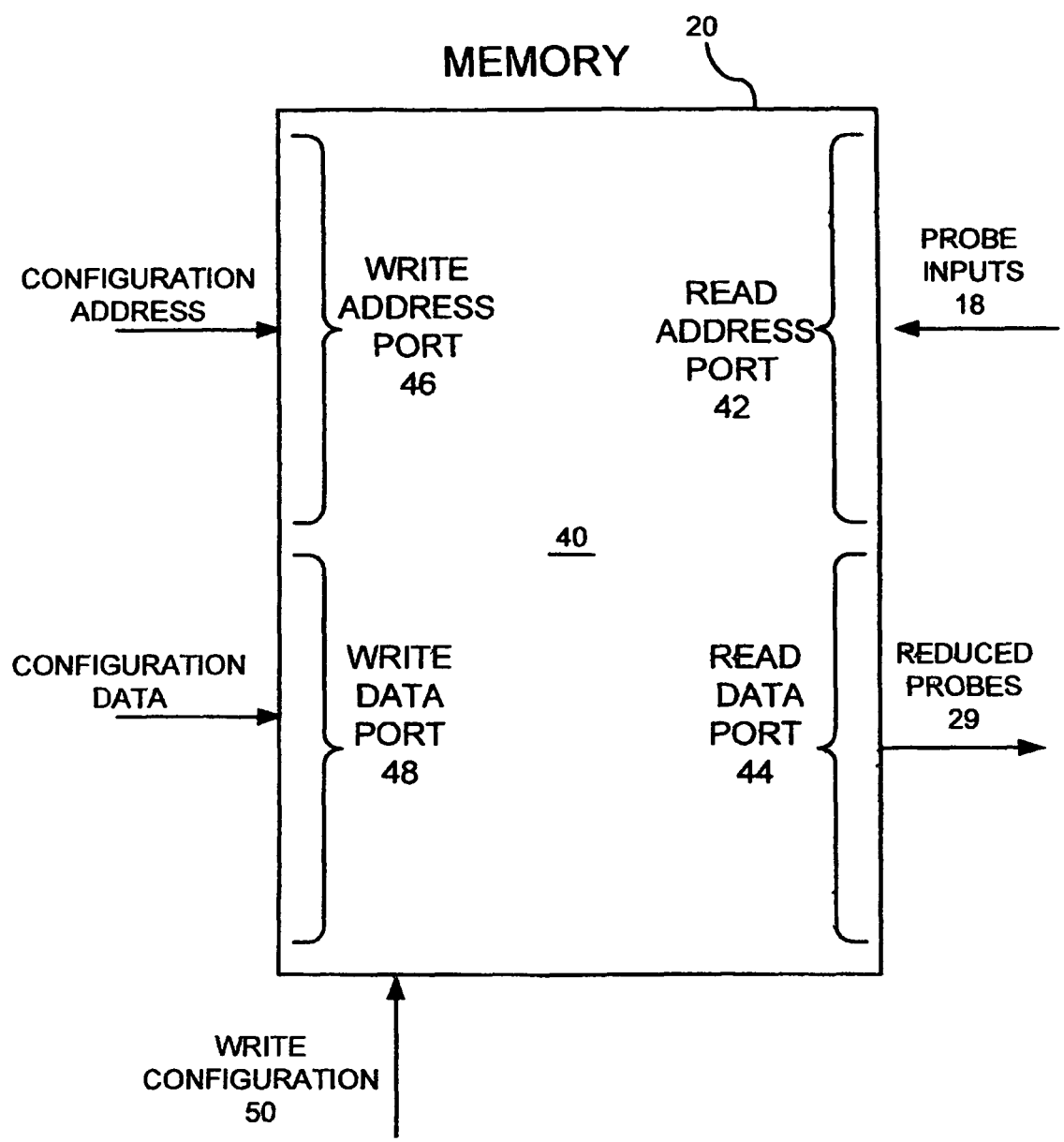
FIG. 2 is a hardware diagram providing further details of one possible embodiment of the probe reduction block of FIG. 1.

FIG. 2 shows an example of the probe reduction logic 20 in more detail. The probe reduction logic 20 includes a memory 40, which may be RAM, or any other type of memory (e.g., ROM, EPROM, Flash, etc). In the illustrated embodiment, the memory 40 is dual-port RAM having a read address port 42, a read data port 44, a write address port 46, and a write data port 48. Probes 18 are coupled to the read address lines 42 and are used to address data representing a reduced set of probes stored in the memory 40. The memory read line (not shown) is tied active so that the reduced set of probes 30 is always output on the memory read port 44. A write configuration line 50, together with configuration address lines coupled to the write address port 46 and configuration data coupled to the write data port 48, are controlled through the host computer 14 and allow the probe reduction logic 20 to be updated dynamically during the emulation without a need to stop the emulator clock. Of course, the emulation clock may also be stopped if desired.

Other memories and connection schemes may be used. For example, the memory read signal need not be tied active, but may instead be separately controlled, such as by the logic analyzer. Additionally, a dual-port RAM is not required. If there is no need to dynamically update the memory, a ROM with only the ability to be read may be used. Those skilled in the art will recognize that there are numerous types of memories and ways to connect such memories in order to perform essentially the same function of probe reduction.

Figure 3:
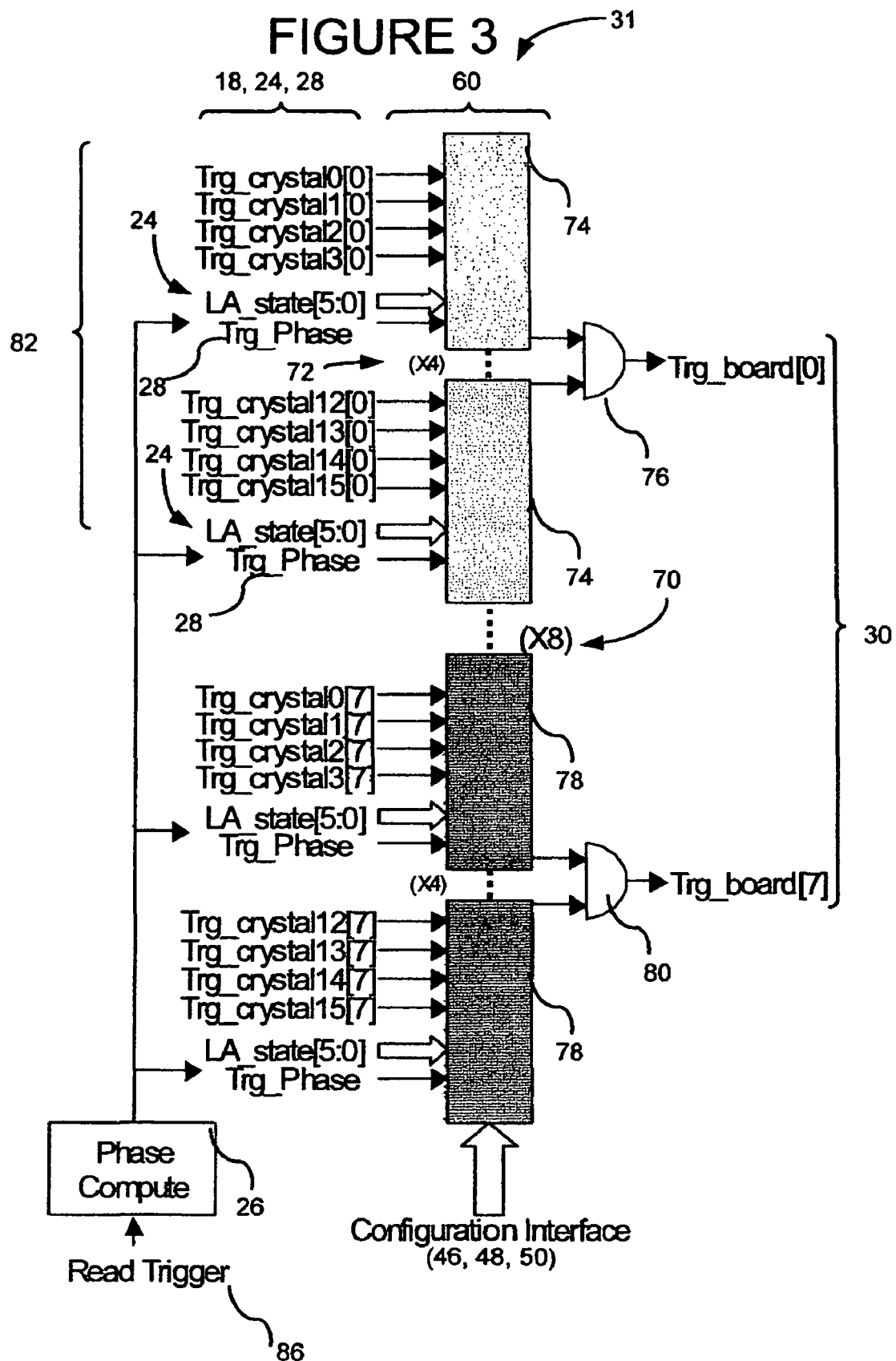
FIG. 3 is a detailed hardware diagram showing an embodiment of the trigger generation block of FIG. 1.

FIG. 3 shows an embodiment of the trigger generation circuit 31, which takes probes 18 directly from the programmable logic blocks 16. Alternatively, the trigger generation circuit can receive reduced probes 29 from the probe reduction logic 20. In this embodiment, instead of only probes 18, also state information 24 from the logic analyzer 22 and phase information 28 from a phase generator 26 may be used as inputs into a memory 60. Ideally, one large memory can be used with an address port driven by all of the probes and state information. But in practice, it is easier to have the memory 60 structured to include multiple and separate memory chips. These memory chips may have same structure as shown in FIG. 2. Although only four separate memory chips are shown, there are eight groups of four memories as indicated at 70 and 72. In a first group 74 of four memories (simply called memory 74), the outputs of the memory are combined through further combinatorial logic shown at 76 (i.e., in this example an AND gate). Likewise, the last group 78 of four memories has outputs combined through combinatorial logic 80. The other memory groups (not shown) have a similar logic structure. There are multiple probe signals coming from multiple boards having a nomenclature Trg_crystal x[y] where x is the probe number and y is the board number. In this embodiment, there are eight separate boards (not shown) used to form the array of programmable logic blocks 16. At the output of the trigger generation logic there are eight trigger signals 30 (Trg_board[0] through Trg_board[7]) representing one trigger signal for each board. These trigger signals 30 are then coupled to the logic analyzer 22 (see also FIG. 1). Each board provides sixteen probe signals that correspond to 16 different programmable FPGAs on the board. For example, board 0 produces probe signals Trg_crystal0[0] through Trg_crystal15[0], as shown at 82. The outputs of memory 74 are coupled to a 4:1 AND gate 76, which outputs the trigger signal Trg_board[0]. The other trigger signals for each board are produced in the same way and will not be further described.

The probe signals 82 are input into the address lines of the memories 74. Additionally, the memory 74 receives state information 24 from the logic analyzer 22, as shown by the signals LA_state[5:0] on the address lines. Finally, the memory 74 receives on the address lines, phase information 28 from a phase generator 26 as shown by the Trg_Phase signals. Thus, the trigger generation scheme takes into account trigger information, state information and phase information in producing the triggers 30. Although a combination of probe, state, and phase are shown, any desired combination may be used, such as only probe, or probe and state, or probe and phase, etc.

A configuration interface 46, 48, 50 allows for the dynamic writing of the memories 40 during the emulation in a manner already described in relation to FIG. 2. The phase generator (also called phase compute) 26 is responsive to a read trigger signal 86 from the logic analyzer and is attached to the highest address bit of each memory chip. Taking phase into consideration allows saving of trigger lines as the triggers 30 are multiplexed so as to contain different trigger signals during phase 0 or 1.

Of course, FIG. 3 is a very specific and detailed example and numerous variations can be made. For example, the combinatorial logic 76, 80 can be more complex, different numbers of input signals may be used, different memory configurations can be implemented, etc.

A similar embodiment as shown in FIG. 3 may also be used for probe reduction logic 20. Alternatively, the simpler embodiment shown in FIG. 2 may be used for trigger generation 30.

Figure 4:
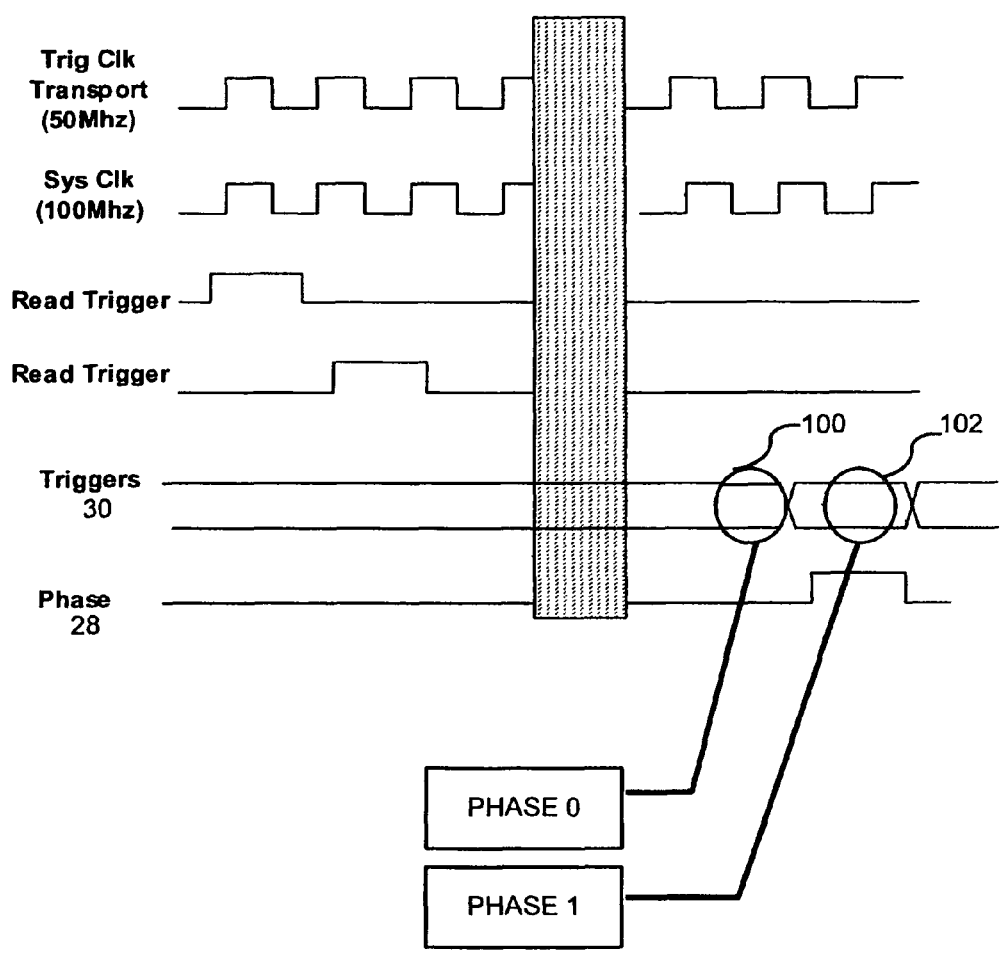
FIG. 4 is a timing diagram associated with the trigger generation block.

FIG. 4 shows a timing diagram of the emulator 12 with various clock signals. Of particular interest are the phase signal 28 and the triggers 30. As can readily be seen, the triggers 30 are multiplexed according to the phase signal 28 so that two sets of triggers may share the same trigger lines 30. The first set of triggers is valid during phase 0 as shown at 100 and a second set of triggers on the same trigger lines 30 are valid during phase 1 shown at 102. Such multiplexing further reduces the number of trigger lines.

Figure 5:
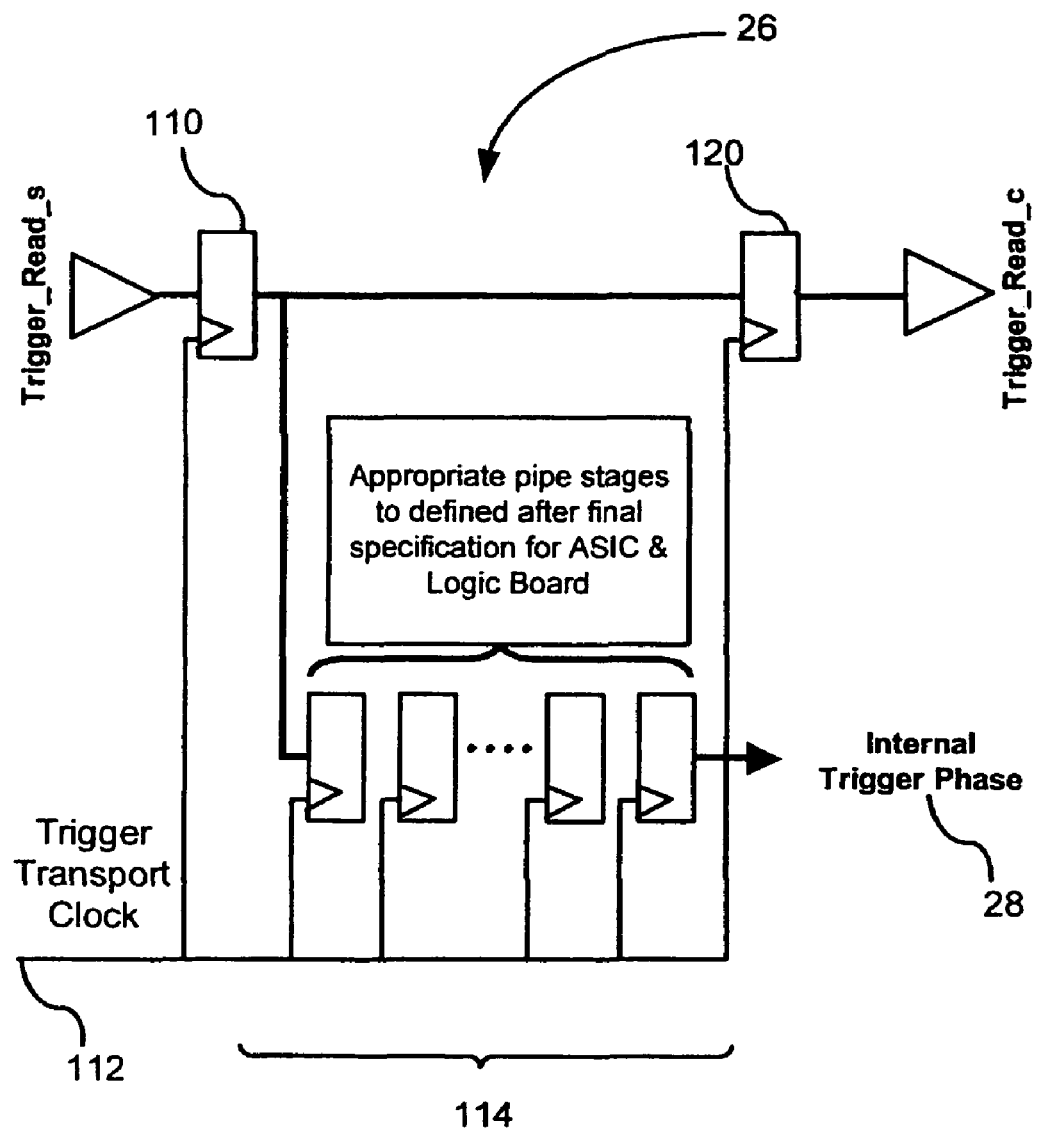
FIG. 5 shows a detailed diagram of a phase computation circuit.

FIG. 5 shows further details of the phase generator 26. A trigger read signal generated from the logic analyzer 22 is input into a flip-flop 110 clocked by a trigger transport clock 112. The frequency of the trigger transport clock is system specific (e.g., 100 Mhz) and any desired frequency may be used. The output of the flip-flop 110 is passed through a simple delay network 114 of flip-flops coupled in series before outputting the trigger phase signal 28 coupled to the address lines of the memory 40. A flip-flop 120 in combination with flip-flop 110 provides a debounce and synchronization circuit for the trigger read signal used in other parts of the system. The delay network is merely to synchronize trigger lines coming from other parts of the system that may have longer propagation delays. For systems without such propagation delays, the phase compute can be eliminated entirely. Additionally, the phase compute can be implemented in many different ways depending on design needs.

Figure 6:
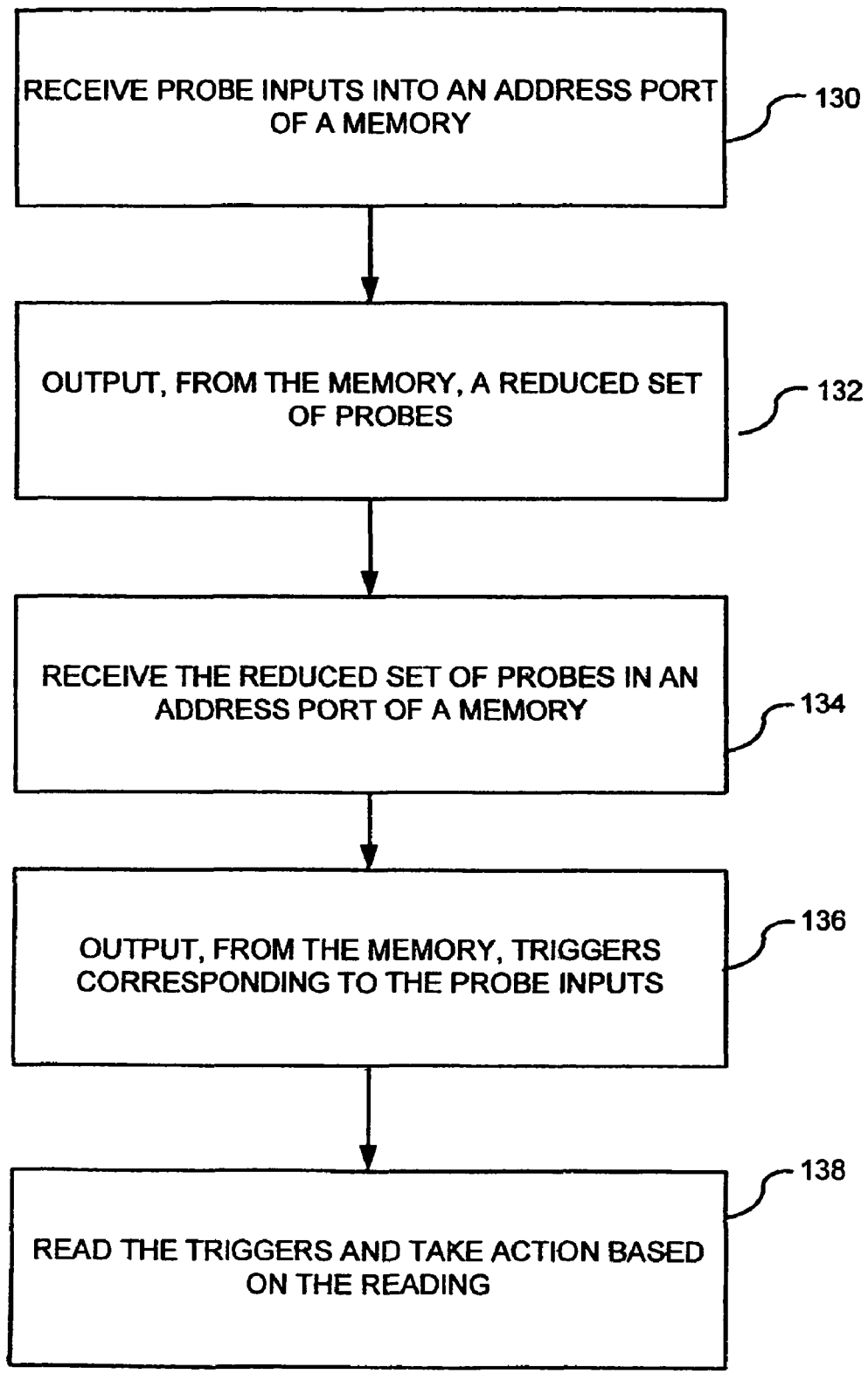
FIG. 6 shows a flowchart of a method for probe reduction and trigger generation.

FIG. 6 shows a flowchart of a method for reducing the number of probes in an emulation environment and generating a trigger. In process block 130, probe inputs are received into an address port of the memory. No phase or state information is required but they may also be used. In process block 132, the memory outputs a reduced set of probes corresponding to the probes on the address input port of the memory. The reduced set of probes may be passed through additional combination logic, if desired. In process block 134, the reduced set of probes are received on the address port of a second memory. In process block 136, the memory outputs on its read port the triggers. In process block 138, the triggers are read or otherwise used to take action such as starting or stopping a trace or an emulation clock.

Figure 7:
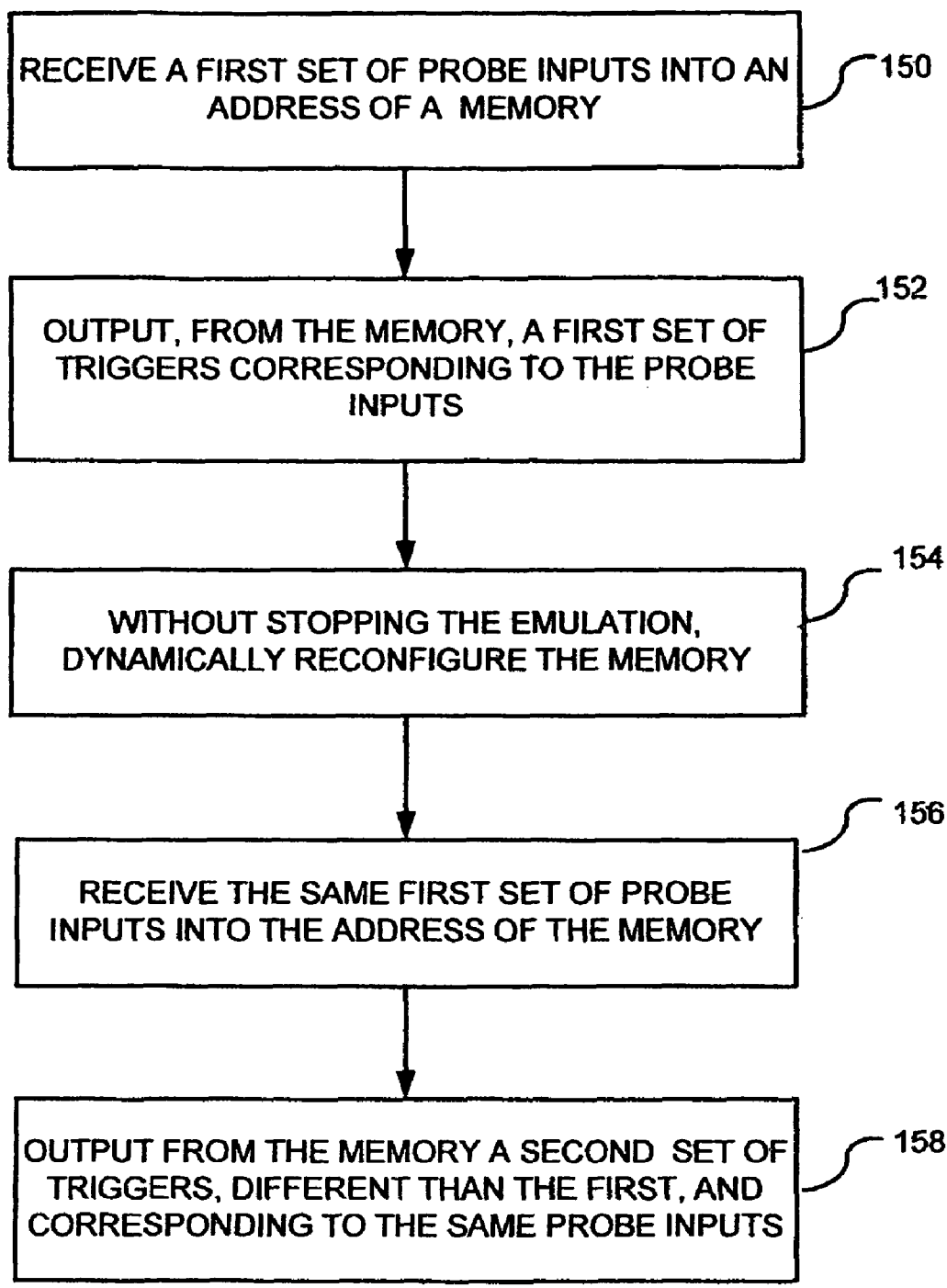
FIG. 7 shows a detailed flowchart of a method for reconfiguration of the trigger generation scheme.

FIG. 7 shows a flowchart of a method for dynamically reconfiguring the triggers. In process block 150, a first set of probe inputs are received on the memory address port in a manner similar to that already described. In process block 152, the memory outputs a set of triggers corresponding to the address input. In process block 154, the emulation is continued while the memory is reconfigured. For example, the memory 40 can be written from the emulation host 14 without stopping the emulation of the user design. In process block 156, the same set of probes as in block 150 are received again on the address lines to the memory. Finally in process block 158 a second set of triggers, different than the first set in process block 152, are output. Thus, reconfiguration of the trigger generation circuit 31 occurred without stopping emulation simply through a write to memory 60. Of course, reconfiguration may also occur while the emulator is stopped. The same dynamic reconfiguration may also be applied to probe reduction in a similar manner.

FIG. 8 shows a flowchart of a method for trigger generation including using state information from the logic analyzer. In process block 170, the probe inputs and state information from the logic analyzer are input into the address port of the memory 60. If desired, one or more phase inputs may also be input into the address port of the memory. In process block 172, the memory outputs a set of triggers based on the address created by the probe lines and the state information from the logic analyzer. In process block 174, the set of trigger lines are read and action is taken based on the reading. For example, a trace within trace memory 32 may be turned on or off or an emulation clock stopped or started.

Having illustrated and described the principles of the illustrated embodiments, it will be apparent to those skilled in the art that the embodiments can be modified in arrangement and detail without departing from such principles.

Those skilled in the art will recognize that the probe lines may be considered as inputs to a Boolean operation. For example, the probe lines may be considered minterms, maxterms, etc.

Although it is generally described that the data output from the memory data port is the set of triggers, a subset or superset of the data may be used as the triggers. For example, less than all of the data output from memory may form the set of triggers. Or the data output may be combined with other triggers to form the set of triggers. The same logic also applies to the probe reduction.

The term "memory" as defined herein may mean a single memory integrated circuit package or many integrated circuit packages coupled together in a way to logically form a larger memory. Other terminology associated with the memory has a similar meaning. Thus, for example, an "address port" to the memory may mean addressing a single memory package or a larger memory formed from several integrated circuit packages or even embedded memory blocks within an ASIC or an FPGA.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

We claim:

1. A method for trigger generation in a hardware emulator, comprising:
   receiving a plurality of input probe signals on an address port to a memory from a programmable integrated circuit within the emulator;
   outputting, from a data port of the memory, data that is addressed, at least in part, by the input probe signals, the memory being a dual-port memory that is writable in order to configure the data output port; and
   using all or a part of the data to form a reduced set of probes or a set of one or more trigger signals.

2. The method of claim 1, further including inputting the data through combinatorial logic to produce the set of trigger signals and further including detecting the set of one or more trigger signals in a logic analyzer.

3. The method of claim 2, further including initiating or stopping a trace in the hardware emulator or turning on or off an emulator clock in response to the detection.

4. The method of claim 1, further including receiving, on the memory address port, state information from a logic analyzer and using the state information in combination with the plurality of input probe signals to address the memory.

5. The method of claim 1, further including receiving, on the memory address port, phase information regarding the phase of a signal in the emulator and using the phase information in combination with the input probe signals to address the memory.

6. The method of claim 1, wherein the input probe signals compared to the set of triggers represent a trigger generation scheme and further including writing to the memory in order to reconfigure the trigger generation scheme in the hardware emulator.

7. The method of claim 6, further including emulating a user design in the emulator and continuing to run the hardware emulator clock and continuing to emulate the design during the reconfiguration.

8. The method of 1, wherein the integrated circuit is one of an array of programmable circuits within the hardware emulator, the programmable circuits being configured to imitate a user design and wherein the memory is a combination of several independent memory chips.

9. The method of claim 1, wherein the memory is a first memory that produces the reduced set of probes and further including receiving the reduced set of probes as input signals on an address port to a second memory and outputting from a data port of the second memory one or more trigger signals.

10. The method of claim 9, further including dynamically reconfiguring the memory of the probe reduction circuit without stopping the emulator clock.

11. A trigger generating apparatus in a hardware emulator, comprising:
    a plurality of programmable integrated circuits within the hardware emulator;
    a plurality of input probe lines coupled to one or more of the programmable integrated circuits; and
    a memory having an address port to which multiple of the input probe lines are connected and a data output port coupled to a reduced set of probes or a set of trigger lines, the memory being a dual-port memory that is writable in order to configure the data output port.

12. The trigger generating apparatus of claim 11, further including trigger configuration address lines coupled to the address port of the memory, trigger configuration data lines coupled to the data port of the memory, and a trigger configuration write signal coupled to the write input of the memory.

13. The trigger generation apparatus of claim 11, further including a logic analyzer having inputs coupled either directly to the data output port of the memory for receiving trigger information or indirectly through combinatorial logic.

14. The trigger generation apparatus of claim 11, further including a trace memory coupled to the logic analyzer and to outputs of the programmable integrated circuits for collecting or terminating trace information from the programmable integrated circuits in response to activation of a trigger.

15. The trigger generation apparatus of claim 11, further including a logic analyzer having outputs indicating the state of the logic analyzer, the logic analyzer outputs being coupled to the address port of the memory together with the input probe lines.

16. The trigger generation apparatus of claim 11, further including a hardware emulation host coupled to the hardware emulator, the hardware emulation host coupled to the memory for writing to the memory in order to change a trigger generation scheme.

17. The trigger generation apparatus of claim 11, wherein the memory is a combination of several different dual-port memory chips.

18. The trigger generation apparatus of claim 11, wherein the programmable integrated circuits are FPGAs.

* * * * *

UNITED STATES PATENT AND TRADEMARK OFFICE
CERTIFICATE OF CORRECTION

| | | |
|---|---|---|
| PATENT NO. | : 7,730,353 B2 | Page 1 of 1 |
| APPLICATION NO. | : 11/517150 | |
| DATED | : June 1, 2010 | |
| INVENTOR(S) | : Brunot et al. | |

It is certified that error appears in the above-identified patent and that said Letters Patent is hereby corrected as shown below:

<u>In the Claims, Column 8</u>:
Line 14, "The method of 1" should be --The method of claim 1--.

Signed and Sealed this
Twelfth Day of July, 2016

Michelle K. Lee
*Director of the United States Patent and Trademark Office*